(12) United States Patent
Kim

(10) Patent No.: US 7,495,983 B2
(45) Date of Patent: Feb. 24, 2009

(54) SEMICONDUCTOR MEMORY DEVICE HAVING BIT LINE EQUALIZER IN CELL ARRAY

(75) Inventor: Dong-Keun Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/647,370

(22) Filed: Dec. 29, 2006

(65) Prior Publication Data

US 2008/0002500 A1    Jan. 3, 2008

(30) Foreign Application Priority Data

Jun. 29, 2006    (KR) ...................... 10-2006-0059070

(51) Int. Cl.
    *G11C 7/00*    (2006.01)
(52) U.S. Cl. ........................ 365/205; 365/202; 365/203
(58) Field of Classification Search ................ 365/205, 365/202, 203
    See application file for complete search history.

(56) References Cited

U.S. PATENT DOCUMENTS 5,828,614 A    10/1998  Gradinariu
6,175,532 B1 *  1/2001  Ooishi .................... 365/230.03
6,205,068 B1    3/2001  Yoon
6,785,176 B2 *  8/2004  Demone ..................... 365/202
2004/0052146 A1  3/2004  Sim
2005/0122811 A1  6/2005  Song et al.

FOREIGN PATENT DOCUMENTS

| JP | 10-289586 | 10/1998 |
| JP | 2005-166252 | 6/2005 |
| KR | 10-2002-0095687 A | 12/2002 |
| KR | 10-2003-0002165 A | 1/2003 |
| KR | 10-2004-0008491 A | 1/2004 |

OTHER PUBLICATIONS

Korean Office Action issued in corresponding Korean Patent Application No. KR 2006-0059070, dated May 31, 2007.
Korean Office Action, issued in corresponding Korean Patent Application No. 10-2006-0059070, dated on Sep. 13, 2007.

* cited by examiner

*Primary Examiner*—Huan Hoang
(74) *Attorney, Agent, or Firm*—McDermott Will & Emery LLP

(57) ABSTRACT

A semiconductor memory device includes at least one cell array and first and second bit line sense amplifying units. A cell array includes a plurality of bit line pairs and a plurality of bit line equalizers connected to each other through a signal line. Each bit line equalizer equalizes a corresponding bit line pair. The first and the second bit line sense amplifying units are alternately connected to the bit line pairs and receive respective bit line equalization signals.

17 Claims, 6 Drawing Sheets ic memory device, and more particularly to a cell array for storing data and a bit line sense amplifier (BLSA) for sensing data by amplifying voltages loaded at a bit line pair.

SEMICONDUCTOR MEMORY DEVICE HAVING BIT LINE EQUALIZER IN CELL ARRAY

CROSS-REFERENCE TO RELATED APPLICATIONS

The present invention claims priority of Korean patent application number 10-2006-0059070, filed on Jun. 29, 2006, which is incorporated by reference in its entirety.

BACKGROUND OF THE INVENTION

The present invention relates to a semiconductor memory device, and more particularly to a cell array for storing data and a bit line sense amplifier (BLSA) for sensing data by amplifying voltages loaded at a bit line pair.

FIG. 1 is a block diagram of a conventional semiconductor memory device having a shared BLSA structure. The semiconductor memory device having the shared BLSA structure provides a BLSA shared by a plurality of cell arrays. A BLSA of the semiconductor memory device shown in FIG. 1 is shared by two cell arrays.

As shown, the semiconductor memory device includes a plurality of block selection units, a plurality of bit line equalization signal (BLEQ) generation units, a plurality of cell arrays, and a plurality of BLSA units. A block selection unit, e.g., BLOCK SELECTION UNIT 0, selects a corresponding cell array of the semiconductor memory device to/from which the data is input/output. A BLEQ generation unit, e.g., BLEQ GENERATION UINT 0, generates a bit line equalization signal, e.g., BLEQ 0, for initializing a bit line pair by equalizing voltages loaded at the bit line pair. A cell array, e.g., CELL ARRAY 0, stores the data. A BLSA unit, e.g., BLSA 0, senses voltage differences between the voltages loaded at the bit line pair.

FIG. 2 is a detailed diagram of two cell arrays and a BLSA depicted in FIG. 1.

The second BLSA unit BLSA 1 is shared by the two cell arrays CELL ARRAY 0 and CELL ARRAY 1. The second BLSA unit BLSA 1 includes a BLSA 201, two bit line equalizers 202U and 202D, a precharger 203, two isolators 204U and 204D, and an output unit 205. The BLSA 201 amplifies a voltage difference between voltages loaded at a bit line pair, e.g., BLU and BLBU. A bit line equalizer, e.g., 202U, equalizes the voltages loaded at the bit line pair, e.g., the upper bit line pair BLU and BLBU, in response to the bit line equalization signal BLEQ. The precharger 203 precharges the bit line pairs at a precharge voltage VBLP in response to the bit line equalization signal BLEQ. The isolators 204U and 204B isolate the cell array units CELL ARRAY 0 and CELL ARRAY 1 and the BLSA 201. In detail, the first isolator 204U isolates the first cell array CELL ARRAY 0 and the BLSA 201; and the second isolator 204D isolates the second cell array CELL ARRAY 1 and the BLSA 201. The output unit 205 outputs the data loaded at the bit line pair to the output line SIO and SIOB in response to an output signal YI, which is generated based on a column address.

The block selection unit shown in FIG. 1 selects a corresponding cell array in response to an active command. In case that the first cell array CELL ARRAY 0 is required to be selected, the first block selection unit BLOCK SELECTION UNIT 0 outputs a first block selection signal bs_0. In response to the first block selection signal bs_0, the first and the second BLEQ generation units BLEQ GENERATION UNIT 0 and BLEQ GENERATION UNIT 1 respectively disable the first and the second BLEQ signals BLEQ0 and BLEQ1 to a logic low level. Accordingly, the first and the second BLSA units BLSA 0 and BLSA 1 neighboring the first cell array CELL ARRAY 0 no longer equalize their respective bit line pairs. That is, the NMOS transistors M0 to M3, which receive the BLEQ signal, are turned off. Meanwhile, the other block selection signals, e.g., bs_1, are enabled at a logic high level and, therefore, the bit line pairs included in unselected cell arrays, e.g., CELL ARRAY 1, are equalized. After a precharge command is activated, the BLEQ signal BLEQ becomes a logic high level. Thereafter, the bit line pair of the first cell array CELL ARRAY 0 is precharged with the precharge voltage VBLP.

As mentioned above, when the first cell array CELL ARRAY 0 is selected in response to the active command, the bit line equalizers included in the first and the second BLSA units BLSA0 and BLSA1 do not perform an equalization operation. Herein, the down bit line pair BLD and BLBD included in the second cell array CELL ARRAY 1 and connected to the second BLSA unit BLSA 1 is disconnected with the second BLSA unit BLSA 1 by the second isolator 204D. The down bit line pair BLD and BLBD is disconnected during an active operation. When the first cell array CELL ARRAY 0 starts to perform the active operation in response to the active command, the down bit line pair BLD and BLBD are precharged with the precharge voltage VBLP. While the first cell array CELL ARRAY 0 proceeds the active operation, a current leakage occurs in the down bit line pair BLD and BLBD and, therefore, voltage levels loaded at the down bit line pair BLD and BLBD are lowered. In this case, when the second BLSA unit BLSA 1 starts a precharge operation, a precharge time increases because the voltage level loaded at the down bit line pair BLD and BLBD has been lowered. Further, in a memory device with large capacity, the size of the cell array is much larger than that of the BLSA unit. Accordingly, a conventional method for equalizing the bit line pair, arranged both in the BLSA unit and the cell array, by only using the bit line equalizer included in the BLSA unit spends long time and, therefore, is inefficient.

SUMMARY OF THE INVENTION

Embodiments of the present invention are directed at providing a semiconductor memory device that efficiently performs a bit line equalization operation by including a bit line equalizer in a cell array.

In accordance with an aspect of the present invention, there is provided a semiconductor memory device which includes at least one cell array and first and second bit line sense amplifying units. The cell array includes a plurality of bit line pairs and a plurality of bit line equalizers connected to each other through a signal line. Each bit line equalizer equalizes a corresponding bit line pair. The first and the second bit line sense amplifying units are alternately connected to the bit line pairs and receive respective bit line equalization signals.

In accordance with another aspect of the present invention, there is provided a semiconductor memory device including a plurality of cell arrays, and a plurality of bit line sense amplifying units. Each cell array includes a plurality of bit line pairs and a plurality of bit line equalizers connected to each other through a signal line. Each bit line equalizer equalizes a corresponding bit line pair. Each of the bit line sense amplifying units is shared by two neighboring cell arrays. Two neighboring BLSA units corresponding to said each cell array are alternately connected to the bit line pairs and receive respective bit line equalization signals.

DESCRIPTION OF SPECIFIC EMBODIMENTS

A semiconductor memory device in accordance with the present invention efficiently performs a bit line equalization operation by including a bit line equalizer in a cell array.

Figure 3:
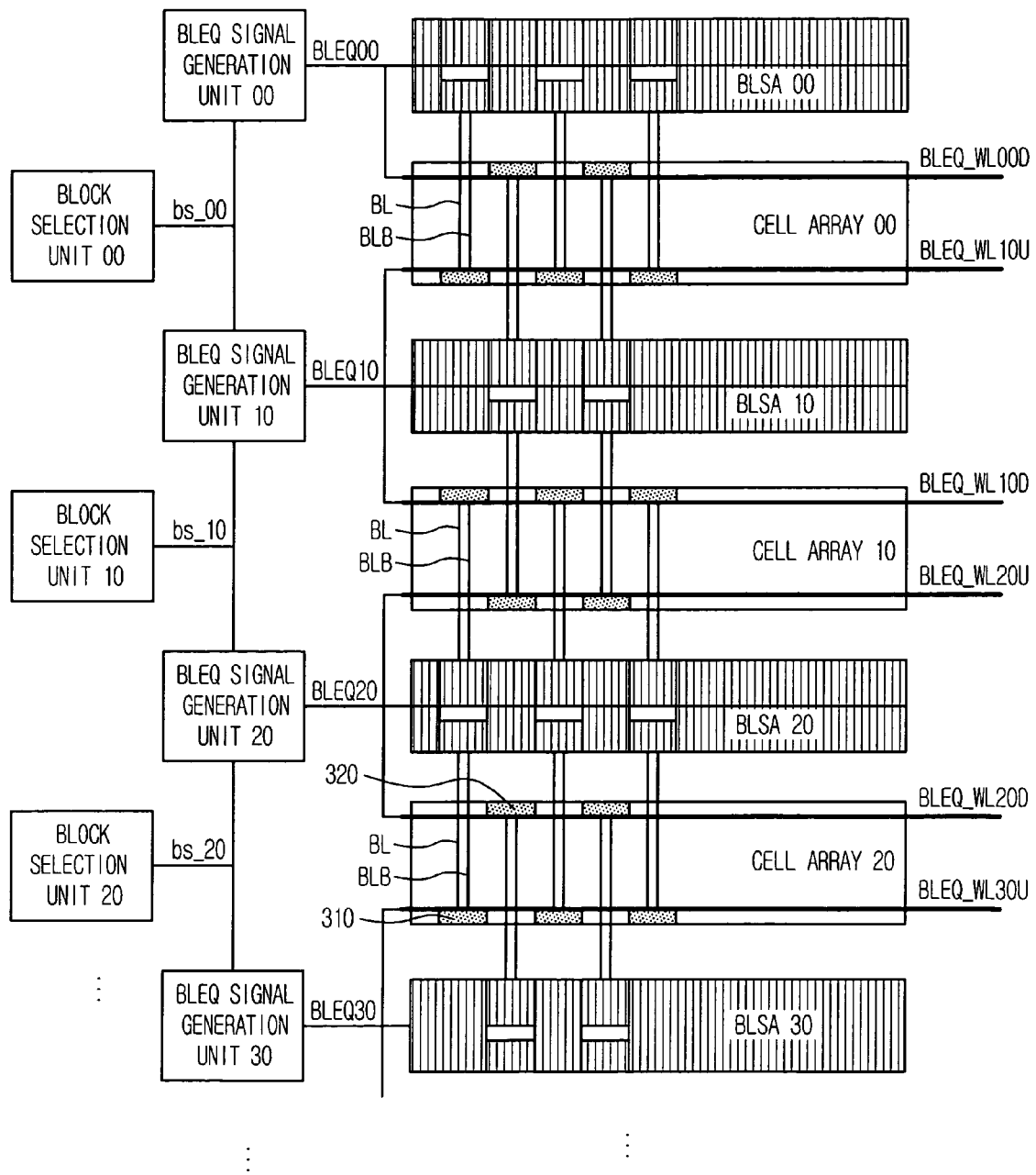
FIG. 3 is a block diagram of the semiconductor memory device having a shared BLSA structure in accordance with an embodiment of the present invention.

FIG. 3 is a block diagram of the semiconductor memory device having a shared bit line sense amplifier (BLSA) structure in accordance with an embodiment of the present invention.

The semiconductor memory device includes a plurality of block selection units, a plurality of bit line equalization signal (BLEQ) generation units, a plurality of cell arrays, and a plurality of BLSA units. The block selection unit, e.g., BLOCK SELECTION UNIT 00, selects a corresponding cell array of the semiconductor memory device to/from which the data is input/output. The BLEQ generation unit, e.g., BLEQ GENERATION UNIT 00, generates a bit line equalization signal, e.g., BLEQ00, for initializing a bit line pair by equalizing voltages loaded at the bit line pair. The cell array, e.g., CELL ARRAY 00, stores the data. The BLSA unit, e.g., BLSA 00, senses a voltage difference between the voltages loaded at the bit line pair.

Figure 1:
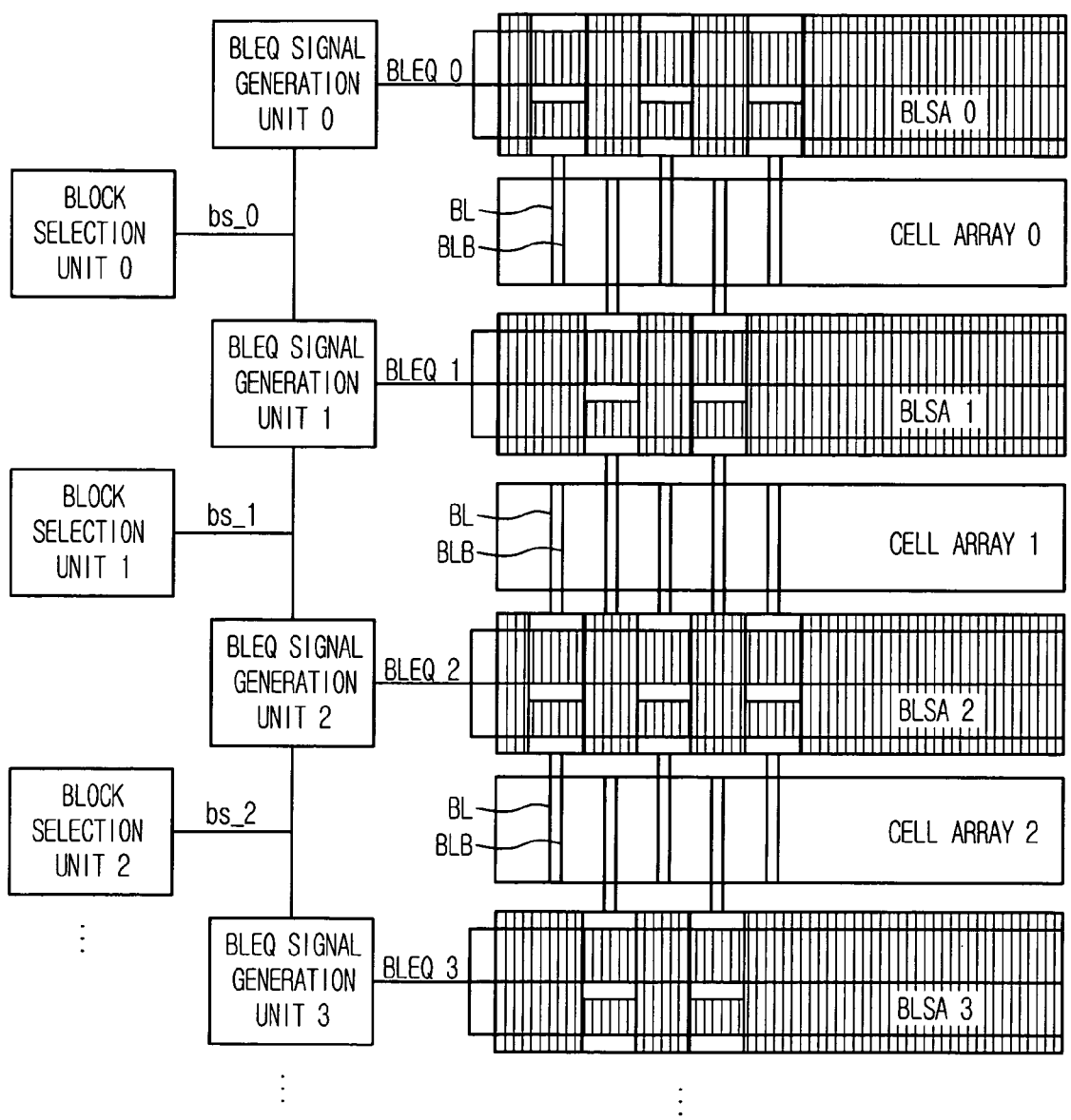
FIG. 1 is a block diagram of a conventional semiconductor memory device having a shared BLSA structure.
Figure 2:
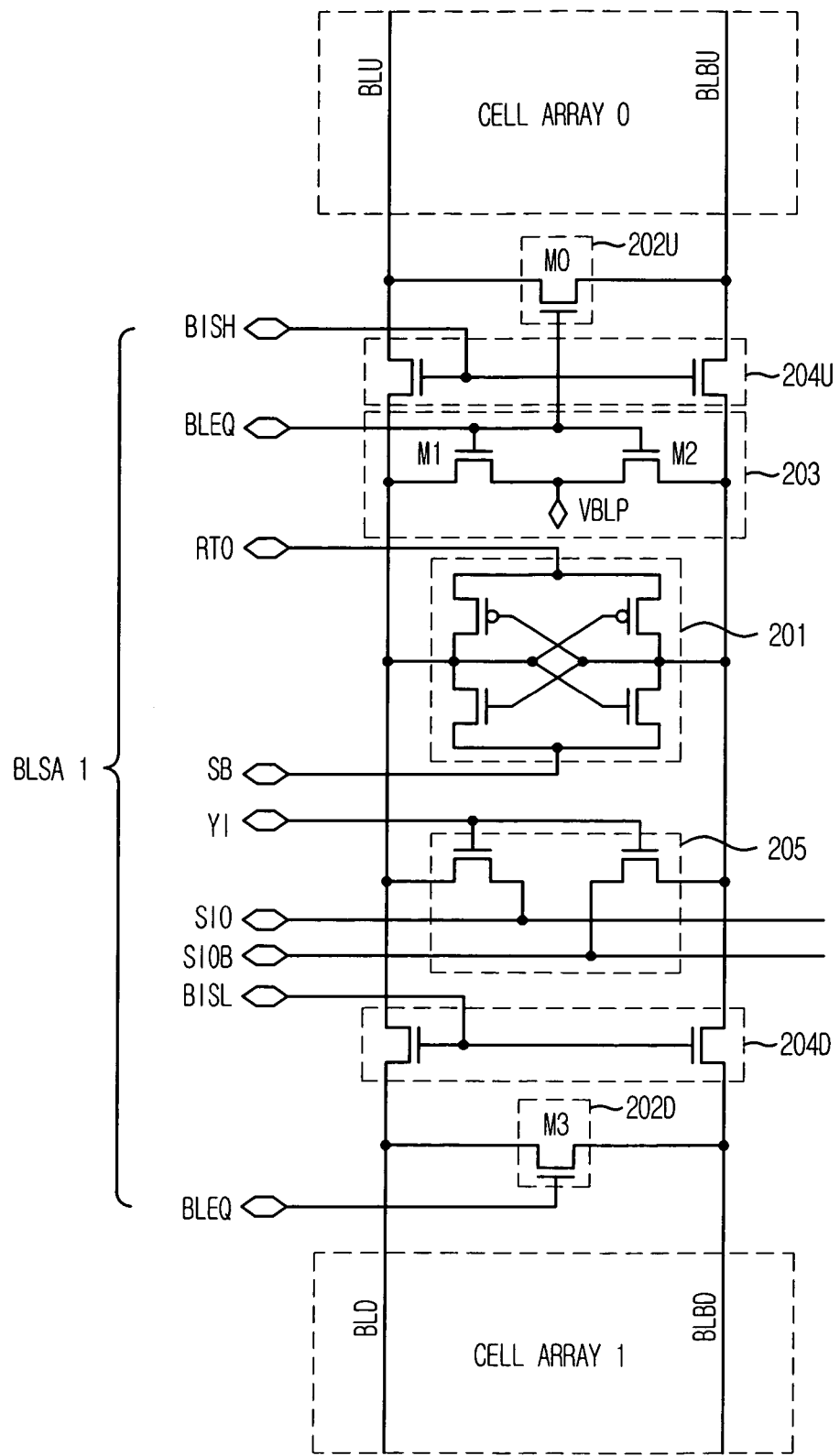
FIG. 2 is a detailed diagram of a cell array and a BLSA shown in FIG. 1.

Compared with the conventional semiconductor memory device shown in FIG. 1, the semiconductor memory device further includes a plurality of cell bit line equalizers, e.g., 310, in each cell array. A cell bit line equalizer, e.g., 310, receives a BLEQ signal input to an neighboring BLSA unit. For example, the cell bit line equalizer 310 included in the third cell array CELL ARRAY 20 is neighboring the fourth BLSA unit BLSA 30. Therefore, the cell bit line equalizer 310 receives the fourth BLEQ signal BLEQ30, which is output from the fourth BLEQ generation unit BLEQ GENERATION UNIT 30, and which is input to the fourth BLSA unit BLSA 30. Meanwhile, another cell bit line equalizer 320 included in the third cell array CELL ARRAY 20 is neighboring to the third BLSA unit BLSA 20. Accordingly, the cell bit line equalizer 320 receives the third BLEQ signal BLEQ20, which is output from the third BLEQ generation unit BLEQ GENERATION UNIT 20, which is input to the third BLSA unit BLSA 20.

Generally, the semiconductor memory device includes dummy word lines in the cell array. Thus, it is possible to use the dummy word lines to transmit the BLEQ signal to the cell bit line equalizer without requiring an additional signal line. The dummy word lines that receive the BLEQ signals are denoted as "BLEQ_WLxxX" in FIG. 3. However, it is still possible to include an additional signal line for transmitting the BLEQ signal to the cell bit line equalizer if required.

The cell bit line equalizer, e.g., 310, is included for efficiently equalizing the bit line pair. It is recommended to place the cell bit line equalizer at the furthest side of the bit line pair from the BLSA unit. That is, the cell bit line equalizer 310 is placed at one edge portion of the bit line pair whose the other edge portion is connected to the third BLSA unit BLSA 20. However, the cell bit line equalizer can be arranged at any location along the bit line pair in the cell array.

Figure 4:
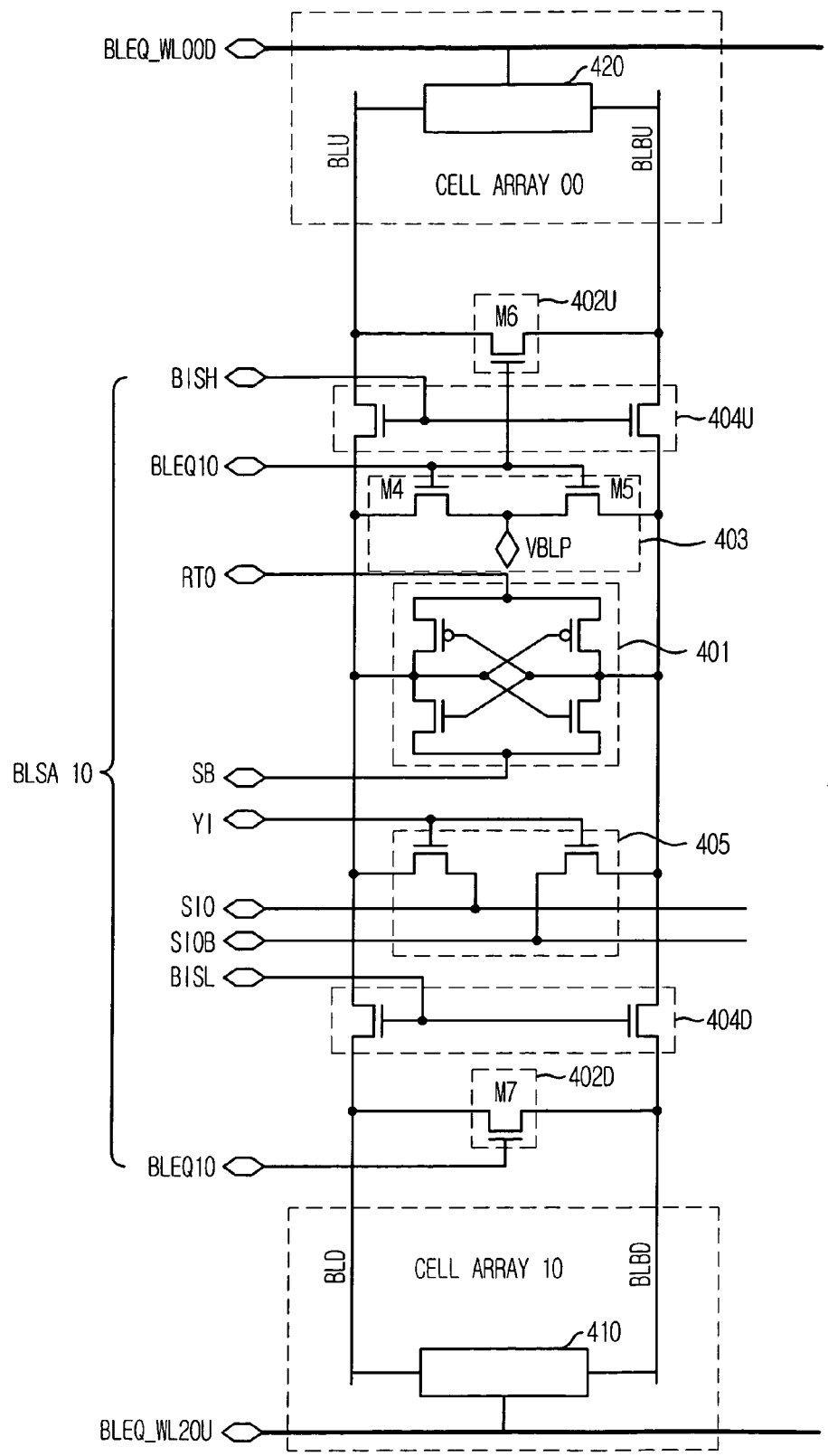
FIG. 4 is a detailed diagram of the first and the second cell arrays and the second BLSA unit shown in FIG. 3.

FIG. 4 is a detailed diagram of the first and the second cell arrays CELL ARRAY 00 and CELL ARRAY 01 and the second BLSA unit BLSA 10 shown in FIG. 3.

The second BLSA unit BLSA 10 is shared by the two cell arrays CELL ARRAY 00 and CELL ARRAY 10. The second BLSA unit BLSA 10 includes a BLSA 401, two bit line equalizers 402U and 402D, a precharger 403, two isolators 404U and 404D, and an output unit 405. The BLSA 401 amplifies voltage difference between voltages loaded at a bit line pair, e.g., BLU and BLBU. The bit line equalizer, e.g., 402U, equalizes the voltages loaded at the bit line pair, e.g., the upper bit line pair BLU and BLBU, in response to the bit line equalization signal BLEQ. The precharger 403 precharges the bit line pairs at a precharge voltage VBLP in response to the bit line equalization signal BLEQ. The isolators 404U and 404B isolate the cell array units CELL ARRAY 00 and CELL ARRAY 10 and the BLSA 401. In detail, the first isolator 404U isolates the first cell array CELL ARRAY 00 and the BLSA 401; and the second isolator 404D isolates the second cell array CELL ARRAY 10 and the BLSA 401. The output unit 405 outputs the data loaded at the bit line pair to the output line SIO and SIOB in response to an output signal YI generated based on a column address. Meanwhile, the cell arrays CELL ARRAY 00 and CELL ARRAY 10 further include cell bit line equalizers 420 and 410.

Figure 5A:
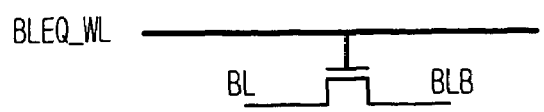
FIGS. 5A to 5C are schematic circuit diagrams of the cell bit line equalizer shown in FIG. 4.
Figure 5B:
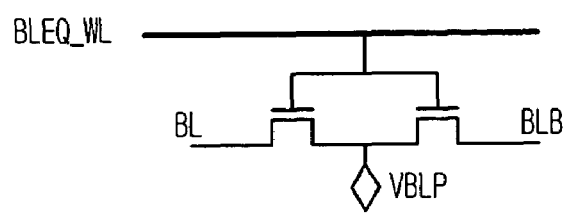
Figure 5C:
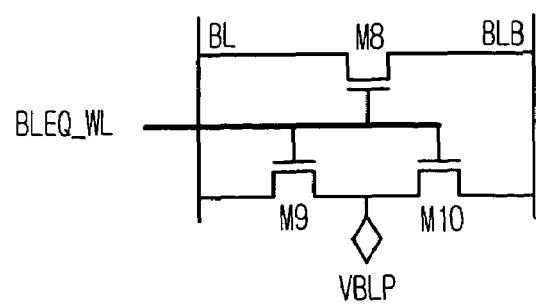

FIGS. 5A to 5C are schematic circuit diagrams of the cell bit line equalizer shown in FIG. 4.

As shown in FIG. 5A, the cell bit line equalizer includes a single NMOS transistor receiving through its gate the BLEQ signal BLEQ transmitted through the dummy word line BLEQ_WL.

The cell bit line equalizer shown in FIG. 5B includes two NMOS transistors serially connected to each other between a bit line BL and a bit line bar BLB of the bit line pair BL and BLB. The two NMOS transistors receive through their gates the BLEQ signal BLEQ transmitted through the dummy word line BLEQ_WL. The node connecting the two NMOS transistors is attached to a precharge voltage VBLP terminal. In this case, the precharge voltage VBLP is directly provided to the bit line pair BL and BLB during a bit line equalization operation. Therefore, the bit line pair BL and BLB, included in a cell array which does not perform a read/write operation, does not float.

The cell bit line equalizer shown in FIG. 5C includes three NMOS transistors M8 to M10. The first NMOS transistor M8 is connected between the bit line BL and the bit line bar BLB of the bit line pair BL and BLB and receives through its gate the BLEQ signal BLEQ transmitted through the dummy word line BLEQ_WL. The second and third NMOS transistors M9 and M10 are serially connected to each other between the bit line BL and the bit line bar BLB of the bit line pair BL and BLB. The second and third NMOS transistors M9 and M10 receive through their gates the BLEQ signal BLEQ transmitted through the dummy word line BLEQ_WL. Further, the node connecting the second and third NMOS transistors M9 and M10 is attached to the precharge voltage VBLP terminal.

The transistors included in the cell bit line equalizers shown in FIGS. 5A to 5C can be implemented with a cell transistor. In this case, the transistors included in the cell bit line equalizer are formed via the same fabrication method as a cell transistor and, therefore, the fabrication process of the semiconductor memory device can be simplified.

Hereinafter, the operation of the semiconductor memory device in accordance with the present invention is described referring to FIGS. 3 to 5C.

In the case that the first cell array CELL ARRAY 00 is required to be selected, the first block selection unit BLOCK SELECTION UNIT 00 outputs a first block selection signal bs_00. In response to the first block selection signal bs_00, the first and the second BLEQ generation units BLEQ GENERATION UNIT 00 and BLEQ GENERATION UNIT 10 respectively disable the first and the second BLEQ signals BLEQ00 and BLEQ10 at a logic low level. Accordingly, the first and the second BLSA units BLSA 00 and BLSA 10 neighboring the first cell array CELL ARRAY 00 no longer equalize their respective bit line pairs. That is, the NMOS transistors M4 to M7 receiving the BLEQ signal are turned off. Meanwhile, the other BLEQ signals, e.g., BLEQ20 and BLEQ30, output from the unselected BLEQ generation units, are held at a logic high level.

The second isolator 404D connected to the second cell array CELL ARARY 10 isolates the second cell array CELL ARRAY 10 from the second BLSA unit BLSA 10 in response to the second isolation signal BISL. The cell bit line amplifier 410 included in the second cell array CELL ARRAY 10 equalizes the voltages loaded at the down bit line pair BLD and BLBD in response to the third BLEQ signal BLEQ 20 transmitted via the dummy word line BLEQ_WL20U. In the case that a cell bit line equalizer shown in either FIG. 5B or FIG. 5C is employed, the down bit line pair BLD and BLBD of the second cell array CELL ARRAY 10 is prevented from being floated. Therefore, the down bit line pair BLD and BLBD of the second cell array CELL ARRAY 10 maintains the precharge voltage VBLP. In this case, when the BLEQ signal BLEQ and the second isolation signal BISL are at the logic high level, a time for equalizing the down bit line pair BLD and BLBD is reduced.

Figure 6:
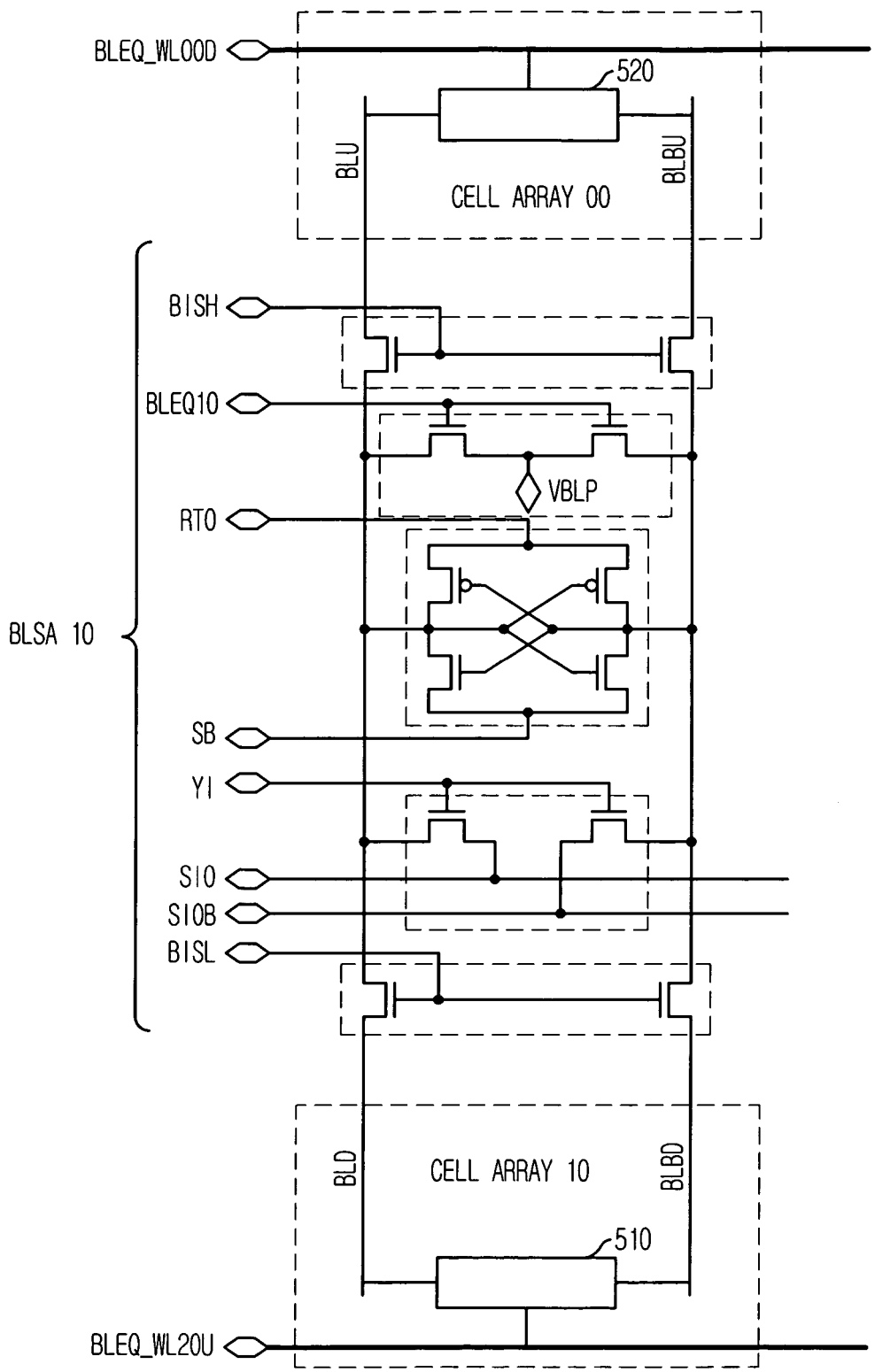
FIG. 6 is a block diagram of a semiconductor memory device in accordance with another embodiment of the present invention.

FIG. 6 is a detailed diagram of the semiconductor memory device in accordance with another embodiment of the present invention.

The semiconductor memory device shown in FIG. 6 does not include a bit line equalizer in the BLSA unit. The semiconductor memory device in accordance with the present invention includes cell bit line equalizers, e.g., 510 and 520, in the cell arrays, e.g., CELL ARRAY 00 and CELL ARRAY 10. Therefore, the BLSA unit, e.g., BLSA 10, is not necessary to include a bit line equalizer because the semiconductor memory device performs the equalization operation by using the cell bit line equalizers. Accordingly, the semiconductor memory device shown in FIG. 6 can reduce the size of the BLSA unit by excluding the bit line equalizer from the BLSA unit.

The present invention includes a cell bit line equalizer in the cell array, therefore, it is possible to efficiently equalize the bit line pair by performing the equalization operation in the cell array with the cell bit line equalizer, as well as performing the equalization operation in the BLSA unit with the bit line equalizer. Further, the bit line pair is prevented from being floated by providing the precharge voltage to the cell bit line equalizer. Therefore, the bit line pair included in a cell array which does not perform a read/write operation maintains its precharge voltage level and reduces a time for precharging the bit line pair. Further, by the present invention it is possible to exclude the bit line equalizer in the BLSA unit and, thus, the size of the BLSA unit can be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    at least one cell array including a plurality of bit line pairs and a plurality of bit line equalizers connected to each other through a signal line, each bit line equalizer providing a bit line precharge voltage signal to a corresponding bit line pair during a bit line equalization operation; and
    first and second bit line sense amplifying (BLSA) units, alternately connected to the bit line pairs, for receiving respective bit line equalization signals,
    wherein the signal line is a dummy word line.

2. The semiconductor memory device as recited in claim 1, wherein the first and the second BLSA units are located on an upper side and a lower side of the cell array, respectively.

3. The semiconductor memory device as recited in claim 2, wherein said bit line equalizers are each placed at one edge portion of the corresponding bit line pair whose the other edge portion is connected to one of the first and the second BLSA units.

4. The semiconductor memory device as recited in claim 3, wherein said each bit line equalizer receives the bit line equalization signal corresponding to the other one of the first and the second BLSA units through the signal line.

5. The semiconductor memory device as recited in claim 1, wherein the bit line equalizer includes two transistors, serially connected to each other between a bit line and a bit line bar of the corresponding bit line pair, having gates receiving the bit line equalization signal loaded at the signal line and a node connecting the two transistors, which is coupled to the bit line precharge voltage signal.

6. The semiconductor memory device as recited in claim 5, wherein the transistors are fabricated by the same method of fabricating a cell transistor included in the cell array.

7. The semiconductor memory device as recited in claim 1, wherein the bit line equalizer includes:
    a first transistor, connected between a bit line and a bit line bar of the corresponding bit line pair, for receiving the bit line equalization signal loaded at the signal line through its gate; and
    a second and a third transistor, serially connected to each other between the bit line and the bit line bar of the corresponding bit line pair, for receiving the bit line equalization signal loaded at the signal line through their gates, and a node connecting the second and the third transistors, which is attached to the bit line precharge voltage signal.

8. The semiconductor memory device as recited in claim 7, wherein the first to the third transistors are fabricated by the same method of fabricating a cell transistor used in the cell array.

9. The semiconductor memory device as recited in claim 1, wherein each of the first and the second BLSA units includes a plurality of BLSA bit line equalizers for equalizing corresponding bit line pairs in response to the corresponding bit line equalization signals.

10. A semiconductor memory device, comprising:
    a plurality of cell arrays, each cell array including a plurality of bit line pairs and a plurality of bit line equalizers connected to each other through a signal line, each bit line equalizer providing a bit line precharge voltage signal to a corresponding bit line pair during a bit line equalization operation; and a plurality of bit line sense amplifying (BLSA) units each of which is shared by two neighboring cell arrays, wherein two neighboring BLSA units corresponding to said each cell array are alternately connected to the bit line pairs and receive respective bit line equalization signals, wherein the signal line is a dummy word line.

11. The semiconductor memory device as recited in claim 10, wherein each of the bit line equalizers receives, through the signal line, the bit line equalization signal corresponding to one of the two neighboring BLSA units.

12. The semiconductor memory device as recited in claim 10, wherein each of the bit line equalizers is placed at one edge portion of the corresponding bit line pair whose the other edge portion is connected to one of the two neighboring BLSA units, and, through the signal line, receives the bit line equalization signal corresponding to the other one of the two neighboring BLSA units.

13. The semiconductor memory device as recited in claim 10, wherein the bit line equalizer includes two transistors serially connected to each other between a bit line and a bit line bar of the corresponding bit line pair and having gates receiving the bit line equalization signal loaded at the signal line, and a node connecting the two transistors, which is coupled to the bit line precharge voltage signal.

14. The semiconductor memory device as recited in claim 13, wherein the transistors are fabricated by the same method of fabricating a cell transistor included in the cell array.

15. The semiconductor memory device as recited in claim 10, wherein the bit line equalizer includes:

a first transistor, connected between a bit line and a bit line bar of the corresponding bit line pair, for receiving the bit line equalization signal loaded at the signal line through its gate; and a second and a third transistor, serially connected to each other between a bit line and a bit line bar of the corresponding bit line pair, for receiving the bit line equalization signal loaded at the signal line through their gates, wherein a node connecting the second and the third transistors is coupled to the bit line precharge voltage signal.

16. The semiconductor memory device as recited in claim 15, wherein the first to the third transistors are fabricated by the same method of fabricating a cell transistor used in the cell array.

17. The semiconductor memory device as recited in claim 10, wherein each of the BLSA units includes a plurality of BLSA bit line equalizers for equalizing the bit line pair in response to the corresponding bit line equalization signals.

* * * * *